US009100007B2

(12) United States Patent
Zhu et al.

(10) Patent No.: US 9,100,007 B2
(45) Date of Patent: Aug. 4, 2015

(54) CASCODE AMPLIFIER (75) Inventors: Haiyang Zhu, Wilmington, MA (US);
Ronald A. Kapusta, Bedford, MA (US)

(73) Assignee: ANALOG DEVICES, INC., Norwood, MA (US)

( * ) Notice: Subject to any disclaimer, the term of this patent is extended or adjusted under 35 U.S.C. 154(b) by 28 days.

(21) Appl. No.: 13/602,429

(22) Filed: Sep. 4, 2012

(65) Prior Publication Data
US 2013/0162354 A1 Jun. 27, 2013

Related U.S. Application Data (60) Provisional application No. 61/579,930, filed on Dec. 23, 2011.

(51) Int. Cl.
*H03F 1/22* (2006.01)
*H03K 17/0416* (2006.01)

(52) U.S. Cl.
CPC .......... *H03K 17/04163* (2013.01); *H03F 1/223* (2013.01)

(58) Field of Classification Search
CPC .......... H03F 3/195; H03F 3/193; H03F 3/72; H03F 2200/18; H03F 2200/294; H03F 3/45179; H03F 1/223; H03F 3/45192; H03F 3/45219; H03F 1/303; H03F 3/45188; H03F 3/1935; H03F 2200/372; H03F 3/345; H03F 3/601; H03F 1/22; H03F 1/0277; H03F 3/68; H03F 1/342; H03F 3/245; H03F 1/086; H03F 2200/144; H03F 2203/45512; H03F 2203/45528; H03G 1/0088
USPC ................................................. 330/277, 311
See application file for complete search history.

(56) References Cited

U.S. PATENT DOCUMENTS

| 5,559,425 | A | 9/1996 | Allman | |
|---|---|---|---|---|
| 6,965,270 | B1 * | 11/2005 | Ross | 330/311 |
| 7,088,187 | B1 * | 8/2006 | Jin et al. | 330/311 |
| 7,323,937 | B2 * | 1/2008 | Ooya et al. | 330/295 |
| 7,342,450 | B2 * | 3/2008 | Jones | 330/253 |
| 7,474,158 | B1 * | 1/2009 | Yim et al. | 330/311 |
| 7,570,119 | B2 * | 8/2009 | Hamaguchi | 330/311 |
| 7,589,593 | B2 * | 9/2009 | Lai et al. | 330/311 |
| 7,852,154 | B2 * | 12/2010 | Cooney | 330/311 |
| 8,102,213 | B2 * | 1/2012 | Tasic et al. | 330/311 |
| 8,125,272 | B1 * | 2/2012 | Voo | 330/252 |
| 8,493,051 | B2 * | 7/2013 | Ivanov et al. | 330/267 |
| 8,624,678 | B2 * | 1/2014 | Scott et al. | 330/311 |
| 2002/0050862 | A1 | 5/2002 | Horie | |

(Continued)

OTHER PUBLICATIONS

PCT International Search Report and Written Opinion for PCT/US2012/67745 mailed on Feb. 19, 2013.

*Primary Examiner* — Khanh V Nguyen
(74) *Attorney, Agent, or Firm* — Kenyon & Kenyon, LLP (57) ABSTRACT A slew rate booster, switchably enabled selector, or other arrangement may be included in a cascode amplifier to keep the current buffer/common gate transistor and the input/common source transistor saturated as the voltage at the source of the current buffer transistor drops during a transient input voltage spike at the gate of the input transistor. In some instances a higher potential may be supplied to a gate of the current buffer transistor during an initial phase of the settling period than during a second phase of the settling period when a lower potential may be applied. Other techniques may be used in different embodiments. Devices and methods are provided.

32 Claims, 7 Drawing Sheets

(56) References Cited

U.S. PATENT DOCUMENTS

| | | | |
|---|---|---|---|
| 2004/0207471 A1* | 10/2004 | Raja et al. | 330/311 |
| 2007/0285175 A1 | 12/2007 | Oh et al. | |
| 2010/0148873 A1* | 6/2010 | Li et al. | 330/277 |
| 2011/0156817 A1 | 6/2011 | Hwang et al. | |

* cited by examiner

CASCODE AMPLIFIER

CROSS-REFERENCE TO RELATED APPLICATIONS

This application claims priority under 35 U.S.C. §119 to provisional application No. 61/579,930, filed Dec. 23, 2011, entitled "Cascode Amplifier," and the content of which is incorporated herein by reference in its entirety.

BACKGROUND

Cascode amplifiers typically include a transconductance amplifier coupled to a current buffer. Existing cascode amplifiers may include a pair of field-effect transistors coupled together, with one converting an input signal voltage to a signal current and having a common source and the other acting as current buffer and having a common gate. When the cascode amplifier is used in a switched-capacitor configuration, the switched-capacitor circuit may sample in a first period of the clock cycle and the amplifier may amplify the sampled signal in a second settling period of the clock cycle. The length of this settling period depends on the clock of the switches. A transient surge may occur at the amplifier input at the beginning of the settling period. As the settling period progresses, feedback at the amplifier input may cause the amplifier input signal to settle towards a final value, which may be reached at the end of the settling period. The amplifier output also reaches its final value at the end of the settling period.

In an NMOS transistor cascode amplifier, a transient surge of the amplifier input voltage causes the current flowing through the common-source input transistor and common-gate buffer transistor to increase. The voltage at the source of the common-gate transistor also decreases, since a fixed bias voltage is applied to its gate. If this voltage drop is large enough, the common-source input transistor leaves the saturated region and enters the triode region, which in turn limits the amplifier slew-rate.

As the settling time is fixed, the limited slew rate decreases the settling accuracy of the amplifier. While increasing the amplifier bandwidth in these instances had been shown to offset the decreased settling accuracy, the increased amplifier bandwidth also increased the resulting noise. Thus, a tradeoff existed between settling accuracy and noise in cascode amplifiers. The inventors perceive a need to increase the slew rate of cascode amplifiers in order to improve the settling accuracy, reduce the small signal bandwidth of the amplifier, and/or reduce the accompanying noise.

DETAILED DESCRIPTION

In an embodiment of the invention, an input transistor having a common source may be coupled in series to a current buffer transistor having a common gate. The source of the current buffer transistor may be coupled to the drain of the input transistor. A slew rate booster may enable different potentials to be applied to the current buffer transistor to keep the current buffer and input transistors saturated as the voltage at the source of the current buffer transistor drops during a transient input voltage spike at the gate of the input transistor. The slew rate booster may include a switchably enabled selector for selecting the different potentials to be applied.

In one embodiment, a higher potential may be supplied to a gate of the current buffer transistor during an initial phase of the settling period. The higher potential at the gate of the current buffer transistor may offset at least part of the voltage drop at the drain of the input transistor and source of the current buffer transistor, thereby preventing the input transistor from transitioning from a saturated state into a triode mode. When the output voltage at the source of the current buffer transistor is close to reaching its settled value, the switchably enabled selector may transition to a lower gate potential until the end of the settling period. A control signal instructing the switchably enabled selector to transition to the lower potential may be generated internally, within the circuit, or the control signal may be supplied from an external source. The transition timing for switching to the lower gate potential may be constant or may vary for different cycles and applications.

Supplying the higher potential to the gate of the current buffer transistor may ensure that after the initial input voltage spike at the gate of the input transistor, the input transistor remains fully saturated, instead of entering the triode region as may occur in conventional cascode amplifiers supplied with lower potentials. This may ensure that the output voltage at the drain of the current buffer transistor also converges more quickly to its settled value after a voltage spike than if the input transistor were to revert to the triode region, where the slew rate is much lower.

Transitioning to the lower potential at the current buffer transistor gate when the output voltage is close to reaching its settled value may ensure that the current buffer transistor is also in the saturation region of operation and produces a high output impedance when the output voltage reaches its settled value.

In some instances, instead of supplying an increased potential at the gate of the current buffer transistor, an alternative signal propagation path may be provided in parallel to the current buffer transistor to provide an alternate path from the drain of the input transistor to the output. The alternative signal path may include the slew rate booster to offset the voltage drop at the drain of input transistor from an input signal voltage surge and keep the input transistor saturated.

In other instances, the alternative signal propagation path may include a separate signal branch from the original input and current buffer transistors. In this instance, the alternative signal propagation path may include a secondary transistor having a gate supplied with the input voltage Vin. The drain of the secondary transistor may then be coupled to a load, output Vout, or source of a tertiary transistor. In those instances where a tertiary transistor is included, the tertiary transistor may be supplied with a gate voltage that is greater than or equal to the gate voltage supplied to the current buffer transistor, and the drain of the tertiary transistor may be coupled to the load or output Vout. A switchably enabled selector may be provided to selectively activate and deactivate the separate signal branch.

Each embodiment may use a switchably enabled selector, be it in the form of one or more switches, a transistor with a higher or variable threshold, or other device, to either boost the voltage at the drain of input transistor or provide an alternative signal propagation path through secondary and/or tertiary transistors during an initial phase of the settling period after an input voltage glitch while switching to a high output impedance state after the initial phase when the output voltage is close to reaching its settled value.

Some embodiments may also enable the use of smaller signal currents through these transistors, which may result in a smaller amplifier bandwidth and less sampled noise in the sampled output.

Figure 1:
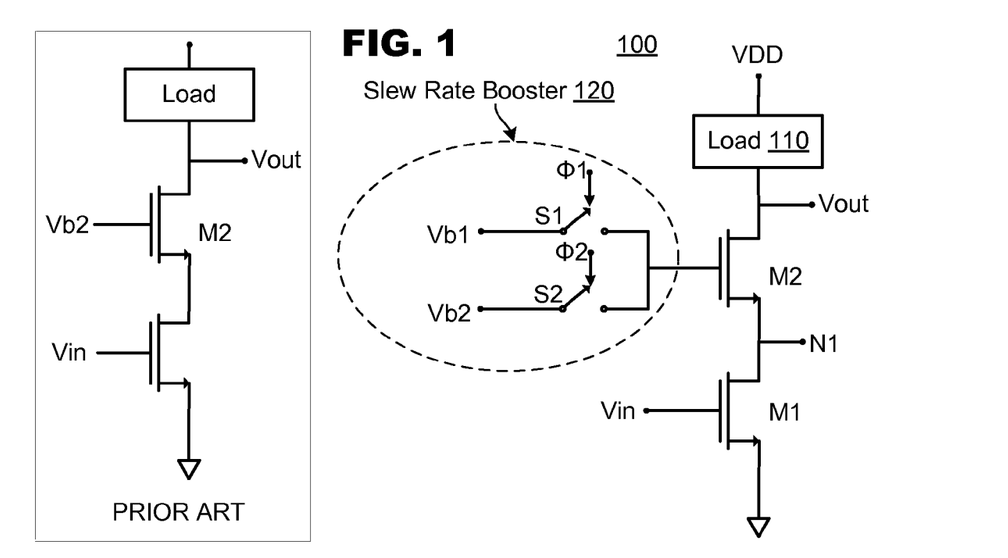
FIG. 1 shows an exemplary configuration of NMOS transistors in an embodiment of the invention.

FIG. 1 shows an exemplary configuration of a cascode amplifier 100 according to an embodiment of the present invention. FIG. 1 also shows a prior art amplifier next to the present invention amplifier 100. In the present invention embodiment 100 shown in FIG. 1, two NMOS transistors may be coupled in series to supply an output voltage Vout to a load 110 which may be coupled to supply voltage VDD. The drain of transistor M2 may be coupled to the load 110 and the source of transistor M2 may be coupled to the drain of transistor M1. The source of transistor M1 may be coupled to a ground. An input voltage Vin may be coupled to a gate of transistor M1. A slew rate booster 120, which may include switchably enabled selector switches S1 and S2 supplied by control signals φ1 and φ2 respectively, may be coupled to the gate of transistor M2. The booster 120 may enable different voltages, such as Vb1 and Vb2, to be selectively coupled to the the gate of transistor M2. For example, switches S1 and S2 may connect respective voltages Vb1 and Vb2 to the gate of transistor M2. Other switch configurations may also be used. For example, a voltage source (not shown) may be selectively added in series to an existing voltage source coupled to the gate of transistor M2 to change the voltage at the gate.

Figure 2:
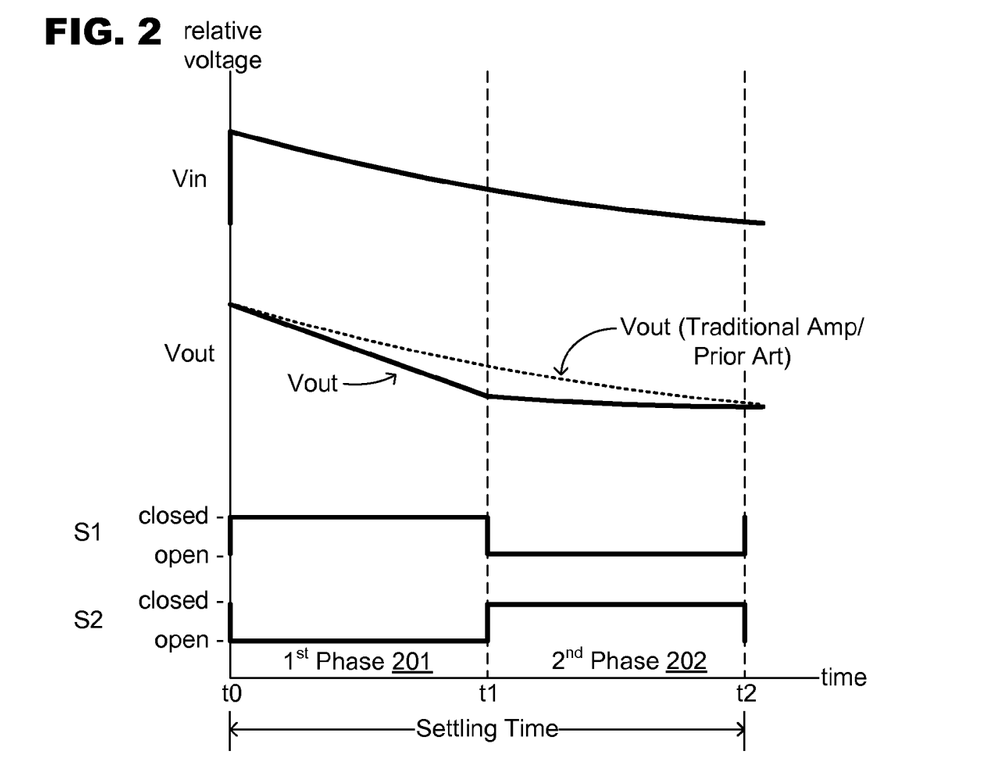
FIG. 2 shows an exemplary comparison of changes to voltages over time in an embodiment of the invention.

FIG. 2 provides graphs showing changes to the output voltages Vout over time between a prior art cascode amplifier and an amplifier according to an embodiment of the present invention in response to a common input signal. A difference between the prior art amplifier shown in FIG. 1 and the amplifier of the present invention shown in FIG. 1 is that a constant voltage was supplied to the gate of transistor M2 in the prior art, whereas a slew rate booster 120 is provided in the present invention to vary the voltage supplied to the gate of transistor M2.

In the present invention, switches S1 and S2 may be toggled to supply the gate of transistor M2 with either voltage Vb1 or Vb2. Voltage Vb1 may be higher than voltage Vb2. The clock phases shown for switches S1 and S2 in FIG. 2 may correspond to respective control signals φ1 and φ2 over time and may subdivide a settling period of the amplifier into two phases 201 and 202. A first clock phase 201 may represent a first portion of the settling period between times t0 and t1 and a second clock phase 202 may represent the remainder of the settling period between times t1 and t2. Switch S1 may be closed and switch S2 may be opened during the first clock phase 201, while the reverse may occur during the second clock phase 202. Both switches S1 and S2 may be opened during sampling.

Since the slew rate of the embodiments shown in the figures and described herein are much larger than that of the prior art, these amplifiers may use a lower bandwidth to reach the same settling accuracy. The lower bandwidth may result in less noise being sampled at the end of the settling period.

The following events may occur between times t0 and t2. At time t0, one or more capacitors in the switched capacitor amplifier including the cascode amplifier may be switched triggering a surge in the input voltage Vin and causing the settling period to begin. At time t0, switch S1 may be closed and switch S2 may be opened, causing the gate of transistor M2 to be supplied with voltage Vb1, which may be a higher than voltage Vb2. However, in the prior art, as shown in FIG. 1, the voltage Vb2 is continuously applied to the gate of transistor M2 instead.

The higher voltage Vb1 applied to the gate of transistor M2 may offset the voltage drop at the drain of transistor M1 (node N1) from the voltage surge at the gate of transistor M1, causing transistor M1 to remain saturated. As a result, the transistor M1 may be able to converge more rapidly to its settled value than if reverted to its triode region, resulting in a higher slew rate between times t0 and t1 than in the prior art, as shown in the exemplary Vout plots.

At time t1, switch S1 may be opened and switch S2 may be closed, causing the gate of transistor M2 to be supplied with voltage Vb2, which may be lower than voltage Vb1. The time t1 may be selected to correspond to an expected time that Vin will settle. The lower voltage Vb2 may maintain the saturation of M1 between times t1 and t2, since the voltage surge should have decreased substantially by time t1, while providing a high output impedance when the output voltage Vout reaches its settled voltage value. It allows the settling times in the present invention, such as in embodiment 100, to be shorter than in the prior art.

Figure 3:
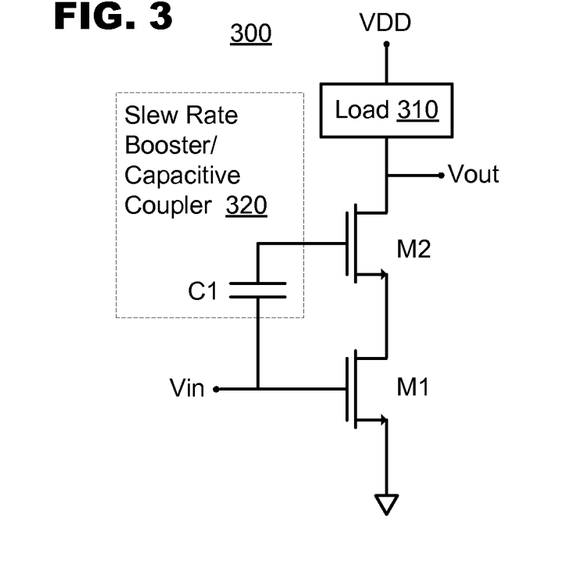
FIG. 3 shows an exemplary embodiment of the invention that includes a capacitive coupling arrangement.

FIG. 3 shows an exemplary embodiment of the invention that includes a slew rate booster 320 in the form of a capacitive coupler coupled between the gate of transistor M2 and the input voltage Vin. In this embodiment 300 two NMOS transistors M1 and M2 may be coupled in series to supply an output voltage Vout to a load 310 which may be coupled to supply voltage VDD. The drain of transistor M2 may be coupled to the load 310 and the source of transistor M2 may be coupled to the drain of transistor M1. The source of transistor M1 may be coupled to a ground. An input voltage Vin may be coupled to a gate of transistor M1 and the gate of transistor M2 through the capacitive coupler slew rate booster 320. As Vin increases, the amplified voltage supplied to the gate of transistor M2 may also increase proportionately.

The capacitive coupler slew rate booster 320 may include a capacitor C1 coupled in series between the input voltage Vin and the gate of transistor M2. In some instances, the capacitive coupler 320 may include a resistor or switch (not shown) that may be coupled to capacitor C1.

The capacitor C1 may be pre-charged to a predetermined DC voltage. The capacitive coupler 320 may include other charge storing circuits in other embodiments that are capable of supplying an increased voltage at the gate of transistor M2 to ensure that the transistor remains saturated during input voltage glitch spikes.

Figure 4:
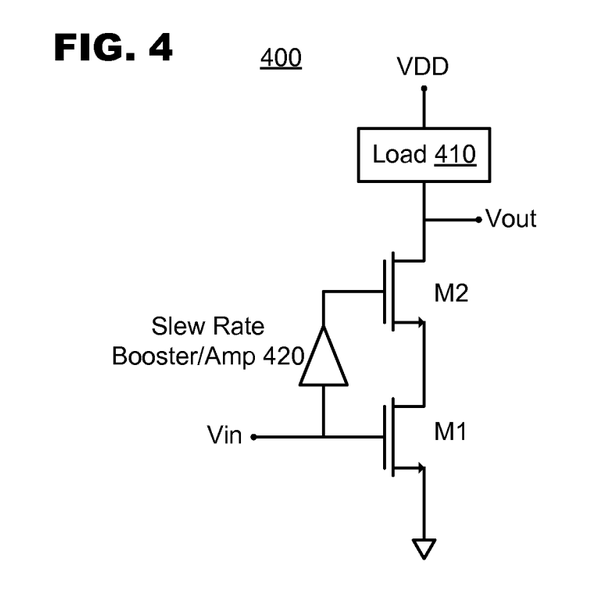
FIG. 4 shows an exemplary embodiment of the invention that includes an amplifier.

FIG. 4 shows an exemplary embodiment of a cascode amplifier 400. In this embodiment 400 two NMOS transistors M1 and M2 may be coupled in series to supply an output voltage Vout to a load 410 which may be coupled to supply voltage VDD. The drain of transistor M2 may be coupled to the load 110 and the source of transistor M2 may be coupled to the drain of transistor M1. The source of transistor M1 may be coupled to a ground. An input voltage Vin may be coupled to a gate of transistor M1. A slew rate booster 420 in the form of an amplifier may be coupled between the input voltage Vin and the gate of transistor M2 may amplify the input signal. As Vin increases, the amplified voltage supplied to the gate of transistor M2 may also increase proportionately.

The amplifier gain may be selected to ensure that transistor M2 remains saturated during capacitor switching voltage glitch spikes in Vin. In some embodiments, a voltage gain of about 2 should be sufficient to prevent transistor M1 from entering the triode region. The increased voltage at transistor M2 will keep to provide a higher voltage to the gate of the prior art cascode amplifier, a constant voltage Vb2 is supplied to the gate of transistor M2.

Figure 5:
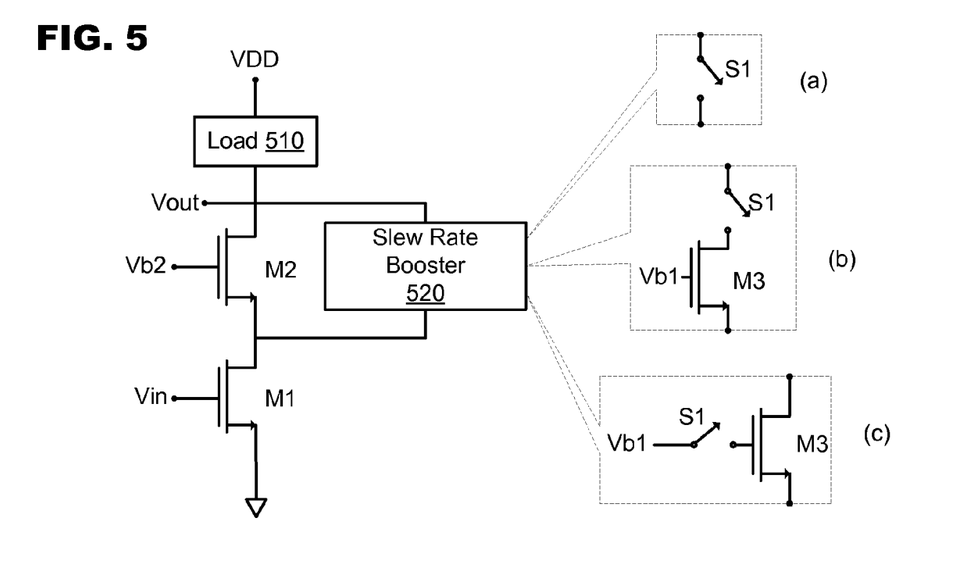
FIG. 5 shows a first exemplary embodiment of the invention that includes a slew rate booster arrangement.

FIG. 5 shows an exemplary embodiment of the invention that includes a slew rate booster 520 coupled in parallel to transistor M2. A slew rate booster 520 may include any circuit configuration that conducts signal current only during an initial phase of the settling period to improve the slew rate of transistor M1 during this period. After the initial phase is completed, the circuit configuration may be open circuited, transitioned to a highly resistive state, or otherwise prevented from conducting signal current for the remainder of the settling period. Three exemplary circuit configurations of the slew rate booster 520 are shown in FIGS. 5(a) to 5(c).

A first circuit configuration 5(a) of the slew rate booster 520 may include a switch S1, which may be closed during an initial phase of the settling period, and then opened for a remainder of the settling period.

A second circuit configuration 5(b) may include a switch S1 coupled to either the source or drain of a third transistor M3. The gate of the third transistor M3 may be supplied with a constant voltage Vb1, which may be higher than the voltage Vb2 supplied to the gate of transistor M2. Switch S1 may be closed during the initial phase of the settling period, and then opened for a remainder of the settling period.

A third circuit configuration 5(c) may include a switch S1 coupled between the gate of a third transistor M3 and a supply voltage Vb1. Supply voltage Vb1 may be higher than voltage Vb2 supplied to the gate of transistor M2. Switch S1 may be closed during the initial phase of the settling period, and then opened for a remainder of the settling period.

Other embodiments may include other types of switchably enabled selectors that enable the slew rate booster 520 to conduct signal current in a first mode during an initial phase of the settling period while preventing the slew rate booster 520 from conducting signal current in a second mode for a remainder of the settling period. For example, the switchably enabled selector may enable a toggling between a lowly resistive state in the first mode and a highly resistive state in the second mode. The gate of transistor M2 may be supplied with a constant voltage Vb2.

Configuring the slew rate booster 520 to enable a majority of the signal current to flow through it during the initial phase of the settling period, such as through the examples shown, may reduce the voltage drop at the drain of transistor M1. The reduced voltage drop may ensure that the transistor M1 remains saturated thereby enabling the output voltage Vout to reach its settled value more quickly.

Transistors M1 and M2 may be coupled in series to the load 510. The drain of transistor M2 may be coupled to the load 510, which may also be coupled to a supply voltage VDD. The source of transistor M2 may be coupled to the drain of transistor M1. The source of transistor M1 may be coupled to a ground or other signal. An input voltage Vin may be supplied to the gate of transistor M1.

Coupling the slew rate booster 520 in parallel to transistor M2 enables the transistor M2 to support lower signal currents than in a conventional cascode amplifier, since the slew rate booster 520 is able to conduct signal current in parallel to transistor M2 during input voltage spikes.

Figure 6:
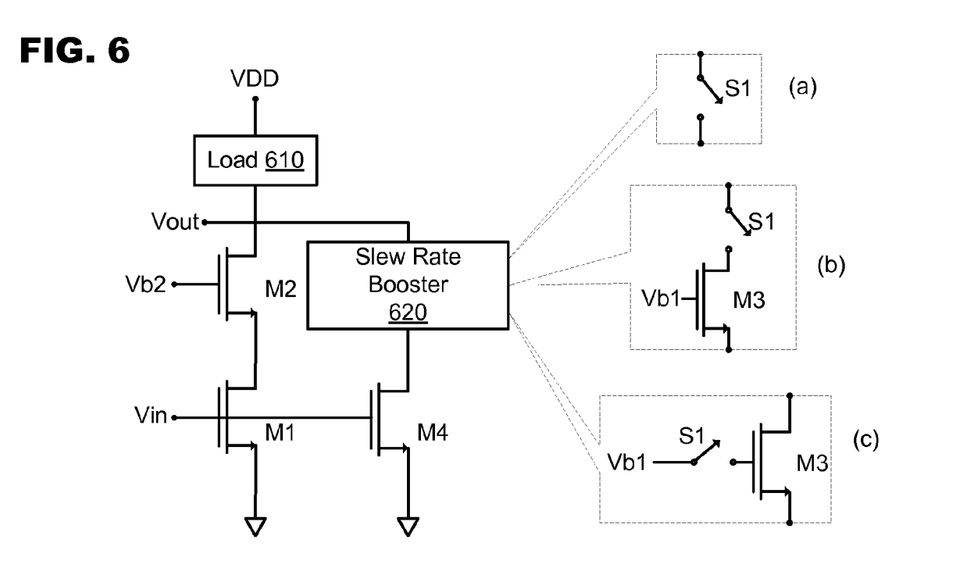
FIG. 6 shows a second exemplary embodiment of the invention that includes a slew rate booster arrangement.

FIG. 6 shows an exemplary cascode amplifier that includes a slew rate booster 620 coupled in parallel to transistors M1 and M2. The slew rate booster 620 may include similar variations (a) to (c) as described with respect to FIG. 5 and/or any circuit configuration that conducts signal current only during an initial phase of the settling period to keep transistor M4 saturated during input voltage glitch surges.

The slew rate booster 620 may be coupled in series to transistor M4. The slew rate booster 620 and transistor M4 may be coupled in parallel to transistors M1 and M2 and/or provide an alternate signal propagation path to that of transistors M1 and M2.

The slew rate booster 620 may include a switchably enabled selector, such as switch S1, that enables signal current to flow during the initial phase of the settling period while preventing signal current from flowing during the remainder of the settling period after the initial phase. A load 610 may be coupled to the slew rate booster 620 and the drain of transistor M2. The load 610 may also be coupled to a supply voltage VDD.

The gate of transistor M2 may be coupled to a constant voltage Vb2. The source of transistor M2 may be coupled to the drain of transistor M1. In embodiments where transistor M3 is included in the slew rate booster 620, the transistor M3 may be supplied with a gate voltage Vb1 that may be greater than or equal to the gate voltage Vb2 supplied to transistor M2.

An input voltage Vin may be supplied to the gates of transistors M1 and M4. The drain of transistor M4 may be coupled to the slew rate booster 620. The source of transistors M1 and M4 may be coupled to a ground or other signal. Coupling the slew rate booster 620 to transistor M4 improves the slew rate than in a conventional cascode amplifier, since the slew rate booster 620 is able to counteract the effects of voltage drops at the drain of transistor M4 from input voltage spikes at the gate of transistor M4 so that transistor M4 remains saturated.

Since the signal current at the drain of transistor M1 is less than a conventional cascode amplifier, the amplifier bandwidth may also be less at the end of the settling period. The lower bandwidth will result in less noise being sampled at the end of the settling period.

Figure 7:
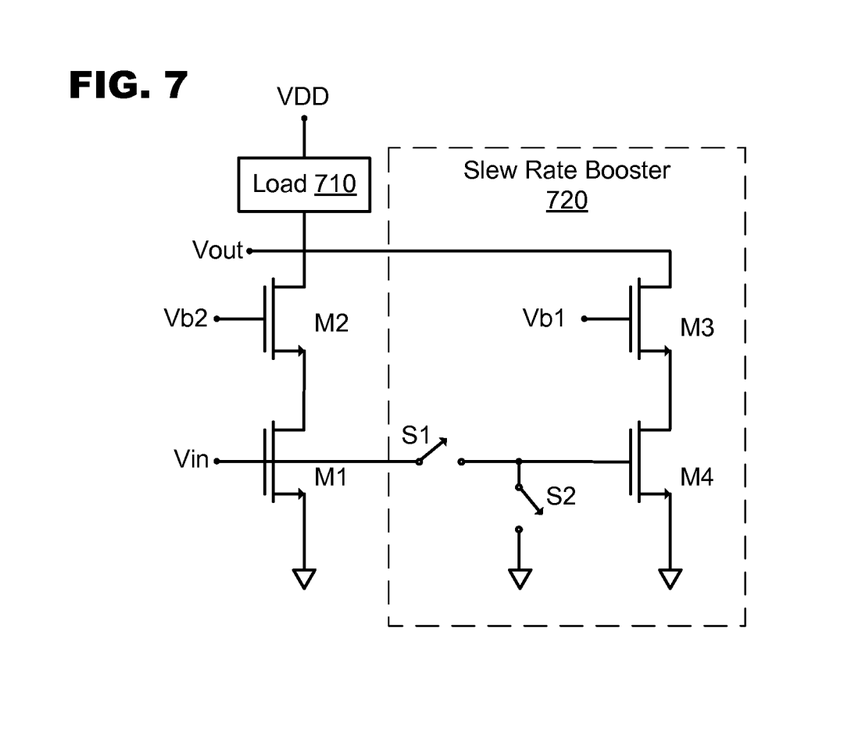
FIG. 7 shows an exemplary embodiment of the invention that includes a transistor having a switchable gate voltage.

FIG. 7 shows an exemplary embodiment of the invention that includes a transistor M4 having a switchable gate voltage coupled in parallel to transistors M1 and M2 as part of a slew rate booster 720. A switchably enabled selector may be coupled to gate of transistor M4. In a first switching state, switch S1 may be closed and S2 opened, causing the gate of transistor M4 to be coupled to the input voltage Vin. In a second switching state, switch S2 may be closed and switch S1 opened causing the gate of transistor M4 to be coupled to a ground or other signal.

The first switching state may be selected during an initial phase of the settling period. The second switching state may be selected for a remainder of the settling period after the initial phase ends. In some embodiments, signal current may flow through transistor M4 only during the first switching state and not the second switching state.

The initial phase of the settling period may end and the transition from the first switching state to the second switching state may occur when the output signal Vout is near its settled value. Transistor M3 need not be included, and may be omitted in some embodiments. In these embodiments, the drain of transistor M4 may be coupled to the drain of transistor M2 and/or the load 710.

In some instances, transistor M3 may be coupled in series to transistor M4. Transistor M3 may be supplied with gate voltage Vb1, which may be greater than or equal to the gate voltage Vb2 supplied to transistor M2 to ensure that transistor M4 remains saturated during the initial phase of the settling period. The drain of transistor M3 may be coupled to the load 710 and/or the drain of transistor M2. The source of transistor M3 may be coupled to the drain of transistor M4.

Transistor M1 may have a lower signal current than existing cascode amplifiers, which in turn results in a lower signal current at the end of the settling period. Since the resulting signal currents are less than a conventional cascode amplifier, the amplifier bandwidth may also be less at the end of the settling period. The lower bandwidth will result in less noise being sampled at the end of the settling period.

Figure 8:
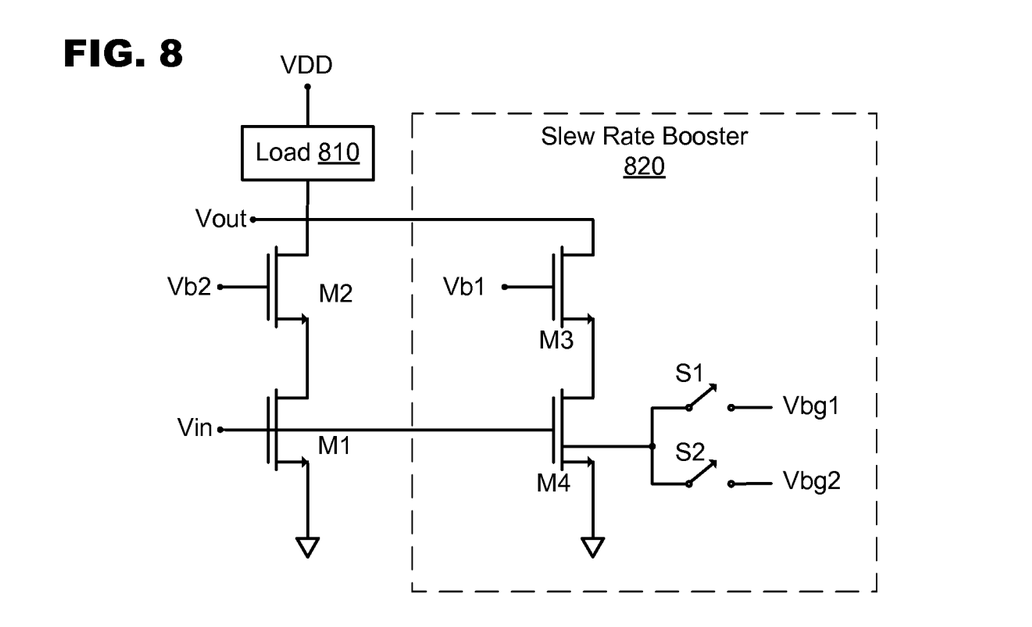
FIG. 8 shows an exemplary embodiment of the invention that includes a transistor having an adjustable threshold voltage.

FIG. 8 shows an exemplary embodiment of the invention that includes a transistor M4 having an adjustable threshold voltage coupled in parallel to transistors M1 and M2 as part of a slew rate booster 820. The gate of transistor M4 may supplied with the input voltage Vin. The threshold value of transistor M4 may be adjusted so that it is lower during the initial phase of the settling period and higher during the remainder of the settling period after the initial phase.

A switchably enabled selector may be coupled to the transistor M4 to supply different potentials, such as Vbg1 and Vbg2, to the transistor in order to raise or lower the voltage required at the gate of the transistor to enable or disable a signal current flow between the source and drain of the transistor M4.

In a first switching state, switch S1 may be closed and S2 opened, supplying a first potential Vbg1 between the gate and backgate of transistor M4. In a second switching state, switch S2 may be closed and S1 opened, supplying a second potential Vbg2 between the gate and backgate of transistor M4. Other switching states and arrangements may also be used in different embodiments.

The potential Vbg1 may be larger than potential Vbg2. This may lower the voltage threshold required to turn on transistor M4 during the initial phase of the settling period. The potential Vbg1 may be selected so that the threshold voltage of M4 is less than or equal to the threshold voltage of M1 during the initial phase of the settling period. The potential Vbg2 may be selected so that threshold voltage of M4 is greater than the threshold voltage of M1 during the remainder of the settling period, such that the input voltage Vin is insufficient to turn on transistor M4.

The first switching state may be selected during an initial phase of the settling period. The second switching state may be selected for a remainder of the settling period after the initial phase ends. In some embodiments, signal current may flow through transistor M4 only during the first switching state and not the second switching state.

The initial phase of the settling period may end and the transition from the first switching state to the second switching state may occur when the output signal Vout is near its settled value. Transistor M3 need not be included, and may be omitted in some embodiments. In these embodiments, the drain of transistor M4 may be coupled to the drain of transistor M2 and/or the load 810.

In some instances, transistor M3 may be coupled in series to transistor M4. Transistor M3 may be supplied with gate voltage Vb1, which may be greater than or equal to the gate voltage Vb2 supplied to transistor M2. The drain of transistor M3 may be coupled to the load 810 and/or the drain of transistor M2. The source of transistor M3 may be coupled to the drain of transistor M4.

The increase of the threshold voltage at transistor M4 as part of the transitioning to the second switching state may cause transistor M4 to turn off thereby preventing signal current from flowing through transistors M3 and M4. Transistor M1 may have a lower signal current than existing cascode amplifiers, which in turn results in a lower signal current at the end of the settling period.

Figure 9:
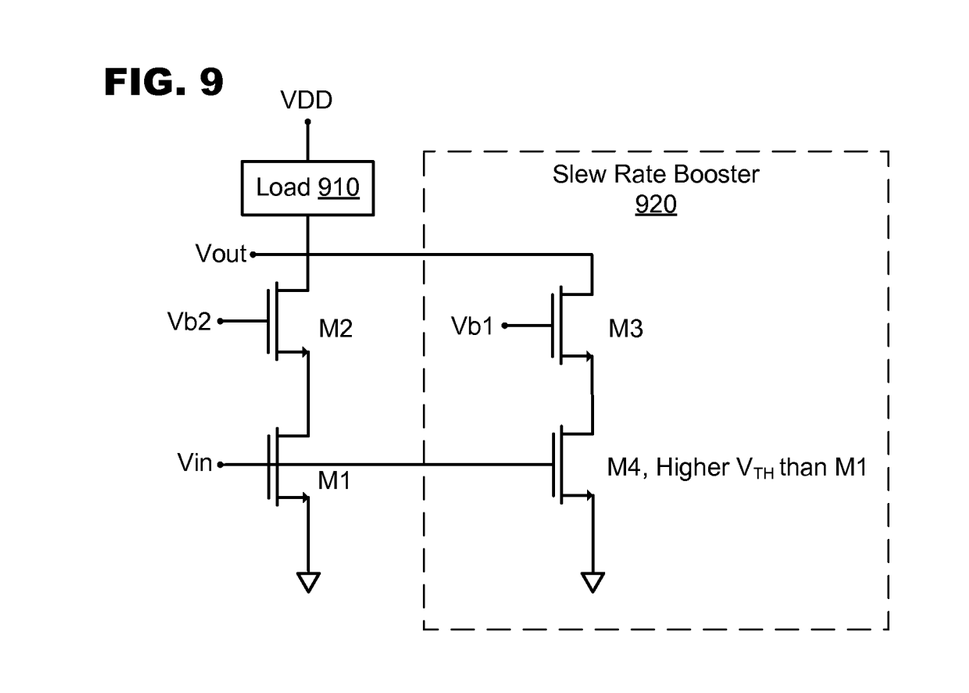
FIG. 9 shows an exemplary embodiment of the invention that includes a transistor having a higher threshold voltage.

FIG. 9 shows an exemplary embodiment of the invention that includes a transistor M4 having a higher threshold voltage than transistor M1, for example due a separate threshold implant step during the IC fabrication process, as part of a slew rate booster 920. Transistor M4 may be coupled in parallel to transistors M1 and M2. The gate of transistor M4 may coupled to an input voltage Vin.

The threshold voltage of transistor M4 may be higher than that of transistor M1. This higher threshold voltage may cause transistor M4 to turn on and enter a saturation region during an input voltage surge caused by a capacitor switching procedure. In some instances, the higher threshold voltage of transistor M4 may also cause the transistor to turn off when input voltage is close to reaching its settled value.

Transistor M3 need not be included, and may be omitted in some embodiments. In these embodiments, the drain of transistor M4 may be coupled to the drain of transistor M2 and/or the load 910.

In some instances, transistor M3 may be coupled in series to transistor M4. Transistor M3 may be supplied with gate voltage Vb1, which may be higher than the gate voltage Vb2 supplied to transistor M2 to ensure that transistor M4 remains saturated during the initial phase of the settling period. The drain of transistor M3 may be coupled to the load 910 and/or the drain of transistor M2. The source of transistor M3 may be coupled to the drain of transistor M4.

The higher voltage threshold of transistor M4 may cause transistor M4 to turn off as the input voltage Vin approaches its settled value, thereby preventing signal current from flowing through transistors M3 and M4. Coupling transistors M3 and M4 as shown enables the transistors to support lower signal currents than in a conventional cascode amplifier, since these transistors are able to counteract the effects of input voltage spikes.

Since the resulting signal current of the transistors is less than a conventional cascode amplifier, the amplifier bandwidth may also be less at the end of the settling period. The lower bandwidth will result in less noise being sampled at the end of the settling period.

Figure 10:
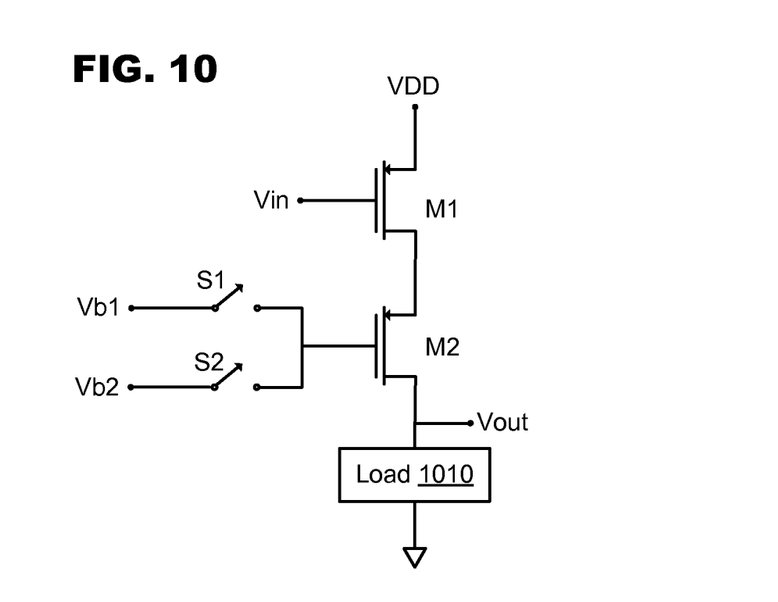
FIG. 10 shows an exemplary configuration of PMOS transistors in an embodiment of the invention.

FIG. 10 shows an exemplary configuration of PMOS transistors in a PMOS embodiment corresponding to the NMOS embodiment shown in FIG. 1. In this embodiment two transistors may be coupled in series to supply an output voltage Vout to a load 1010 which may be coupled to a ground. The drain of transistor M2 may be coupled to the load 1010 and the source of transistor M2 may be coupled to the drain of transistor M1. The source of transistor M1 may be coupled to a supply voltage VDD or other voltage. An input voltage Vin may be coupled to the gate of transistor M1.

A switchably enabled selector may be coupled to the gate of transistor M2. The switchably enabled selector may enable different voltages, such as Vb1 and Vb2, to be selectively coupled to the gate of transistor M2. For example, the switchably enabled selector may include two switches S1 and S2, which may connect respective voltages Vb1 and Vb2 to the gate of transistor M2. Other switch configurations may also be used.

In the NMOS embodiments, the voltage Vb1 supplied during the initial phase of the settling period may be greater than the voltage Vb2 supplied during the remainder of the settling period. In the PMOS embodiments, the reverse may occur; the voltage Vb1 supplied during the initial phase of the settling period may be less than the voltage Vb2 supplied during the remainder of the settling period. Similar principles may be applied to other described embodiments in which PMOS transistors are used instead of NMOS.

Figure 11:
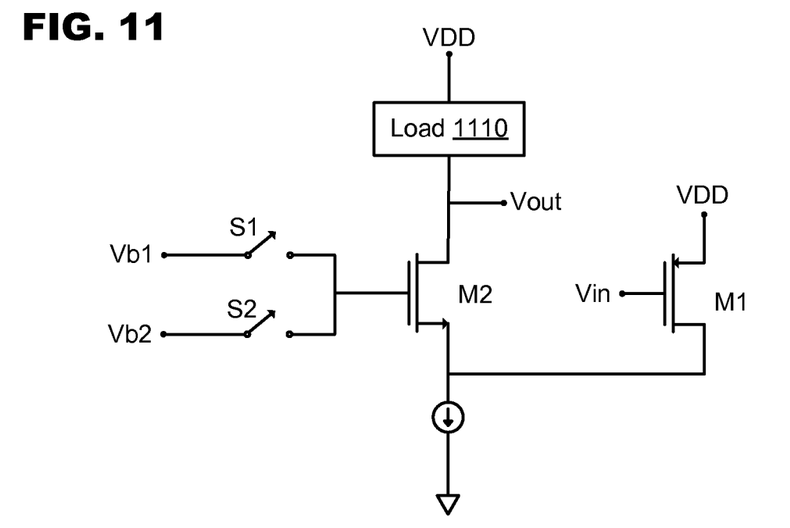
FIG. 11 shows a first exemplary configuration of a folded cascode amplifier in an embodiment of the invention.

FIG. 11 shows a first exemplary configuration of a folded cascode amplifier in an embodiment of the invention. An input voltage Vin may be supplied to a gate of PMOS transistor M1. A supply voltage VDD or other voltage may be supplied to the source of transistor M1. The drain of transistor M1 may be coupled to the source of transistor M2 and a current source. The current source may include any type of current generating device, including, but not limited to, a biased NMOS transistor.

A switchably enabled selector may be coupled to the gate of NMOS transistor M2. The switchably enabled selector may enable different voltages, such as Vb1 and Vb2, to be selectively coupled to the gate of transistor M2. For example, the switchably enabled selector may include two switches S1 and S2, which may connect respective voltages Vb1 and Vb2 to the gate of transistor M2. Other switch configurations may also be used.

In embodiments where transistor M2 is NMOS, the voltage Vb1 supplied during the initial phase of the settling period may be greater than the voltage Vb2 supplied during the remainder of the settling period. A load 1110 and/or voltage output may be coupled to the drain of transistor M2.

In FIG. 11, transistor M1 is shown as a PMOS transistor coupled to a current source, while in other embodiments, such as FIGS. 1 and 3 to 9, transistor M1 is shown solely as NMOS transistor. In those instances where transistor M1 is provided as an NMOS transistor, the NMOS transistor M1 may be replaced with a PMOS transistor coupled to a current source, as shown, for example, in FIG. 11. Other current source to PMOS transistor couplings may also be possible in other embodiments. Thus, in different embodiments transistor M1 may be provided as either an NMOS or PMOS transistor.

Similarly, transistor M4, which is shown as an NMOS transistor, in for example FIGS. 1 and 3 to 9, may also be replaced with a PMOS transistor coupled to a current source to produce a similar effect. Thus, in different embodiments transistor M4 may also be provided as either an NMOS or PMOS transistor.

Figure 12:
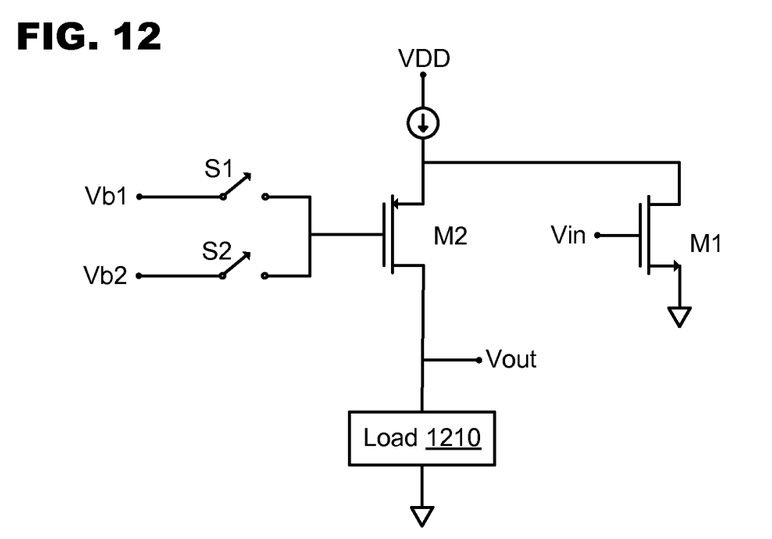
FIG. 12 shows a second exemplary configuration of a folded cascode amplifier in an embodiment of the invention.

FIG. 12 shows a second exemplary configuration of a folded cascode amplifier in an embodiment of the invention. An input voltage Vin may be supplied to a gate of NMOS transistor M1. The source of transistor M1 may be coupled to a ground or other signal. The drain of transistor M1 may be coupled to the source of transistor M2 and a current source. The current source may include any type of current generating device, including, but not limited to, a biased PMOS transistor.

A switchably enabled selector may be coupled to the gate of PMOS transistor M2. The switchably enabled selector may enable different voltages, such as Vb1 and Vb2, to be selectively coupled to the gate of transistor M2. For example, the switchably enabled selector may include two switches S1 and S2, which may connect respective voltages Vb1 and Vb2 to the gate of transistor M2. Other switch configurations may also be used.

In embodiments where transistor M2 is PMOS, the voltage Vb1 supplied during the initial phase of the settling period may be less than the voltage Vb2 supplied during the remainder of the settling period. A load 1210 and/or voltage output may be coupled to the drain of transistor M2.

In FIG. 12, transistor M1 is shown as an NMOS transistor coupled to a current source, while in other embodiments, such as FIG. 10 transistor M1 is shown solely as PMOS transistor. In those instances like FIG. 10 where transistor M1 is provided as an PMOS transistor, the PMOS transistor M1 may be replaced with an NMOS transistor coupled to a current source, as shown, for example, in FIG. 12. Other current source to NMOS transistor couplings may also be possible in other embodiments. Thus, in different embodiments transistor M1 may be provided as either an NMOS or PMOS transistor.

Similarly, in some embodiments transistor M4 may also be provided as a PMOS transistor. In these instances, PMOS transistor M4 may also be replaced with an NMOS transistor coupled to a current source to produce a similar effect. Thus, in different embodiments transistor M4 may also be provided as either an NMOS or PMOS transistor.

Figure 13:
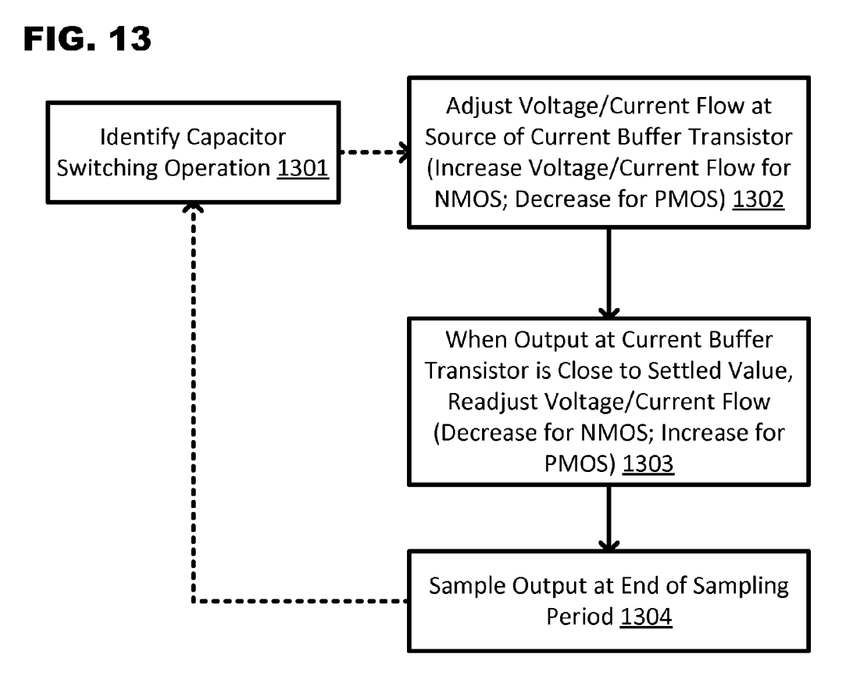
FIG. 13 shows an exemplary process for improving the slew rate and reducing the amplifier bandwidth of a cascode amplifier in an embodiment of the invention.

FIG. 13 shows an exemplary process for improving the slew rate and reducing the amplifier bandwidth of a cascode amplifier in an embodiment of the invention. The process may be implemented in a cascode amplifier which may include a current buffer transistor coupled to an input transistor. A source of the current buffer transistor may couple to a drain of the input transistor. An input voltage may be supplied to the gate of the input transistor. An output voltage may be sampled at the drain of the current buffer transistor, which may also be coupled to a load 110.

In box 1301, a capacitor switching operation in the amplifier may be identified. The capacitor switching operation may produce a transient voltage glitch in the input voltage coupled to the gate of the input transistor.

In box 1302, a potential at the source and/or current flow between the drain of the input transistor and source of the current buffer transistor may be adjusted. If the current buffer transistor is a NMOS transistor, the potential at the source and/or current flow may be increased to ensure that the input transistor remains fully saturated in spite of a voltage decrease and current increase at the drain of the input transistor resulting from the voltage glitch. If the current buffer transistor is a PMOS transistor, the potential at the source may be decreased while the current flow is increased. In some embodiments, this may occur by adjusting the voltage at the gate of the current buffer transistor or by providing an alternative signal propagation path for the current at the drain of the input transistor. The current buffer transistor may remain at the adjusted potential/current flow state for an initial phase of the settling period until the output voltage at the drain of the current buffer transistor is close to its settled value. The length of this initial phase may be calculated or predetermined through experimentation.

In box 1303, when the voltage output at the drain of the current buffer transistor is determined to be close to its settled value, the initial phase of the settling period may end and the potential at the source of the current buffer transistor may be readjusted for the remainder of the sampling period. If the current buffer transistor is a NMOS transistor, the potential and/or current flow may be reduced from its increased state as part of the readjustment. If the current buffer transistor is a PMOS transistor, the potential may be decreased and/or the current flow may be increased from its reduced state as part of the readjustment for PMOS current buffer transistors. The potential/current flow may be readjusted to its original value or it may be readjusted to another value that provides for a high output impedance at the drain of the current buffer transistor.

In box 1304, the output voltage at the drain of the current buffer transistor may be sampled after reaching its settled value. This sampling may occur at the end of the sampling period. After sampling the output, the process may repeat itself.

The foregoing description has been presented for purposes of illustration and description. It is not exhaustive and does not limit embodiments of the invention to the precise forms disclosed. Modifications and variations are possible in light of the above teachings or may be acquired from the practicing embodiments consistent with the invention. For example, in different embodiments one or more transistors may also be provided as NMOS or PMOS transistors.

We claim:

1. A cascode amplifier comprising:
    a common gate transistor;
    a common source transistor coupled in series to the common gate transistor; and
    a slew rate booster coupled to a drain of the common gate transistor and configured to vary a signal current flow through the slew rate booster during a settling period of a capacitor switching operation, wherein the slew rate booster includes a switchably enabled selector configured to vary the signal current flow in response to a control signal.

2. The cascode amplifier of claim 1, wherein the switchably enabled selector is configured to enable the signal current flow during a first phase of the settling period in response to a first clock phase of the control signal, and prevent the signal current flow during a second phase of the settling period in response to a second clock phase of the control signal.

3. The cascode amplifier of claim 1, wherein the slew rate booster is coupled in parallel to the common gate transistor.

4. The cascode amplifier of claim 1, wherein:
    the slew rate booster includes a first slew rate transistor, a second slew rate transistor, and the switchably enabled selector,
    a drain of the first slew rate transistor is coupled to the drain of the common gate transistor,
    a gate of the first slew rate transistor is supplied with a gate voltage at least equal to that supplied to a gate of the common gate transistor,
    a source of the first slew rate transistor is coupled to a drain of the second slew rate transistor, and
    the switchably enabled selector is configured to adjust the current flow through the second slew rate transistor during the settling period.

5. The cascode amplifier of claim 4, wherein the switchably enabled selector is coupled between a gate of the second slew rate transistor and a gate voltage supplied to a gate of the common source transistor and configured to selectively connect the gate of the second slew rate transistor to the gate voltage supplied to the gate of the common source transistor.

6. The cascode amplifier of claim 4, wherein:
    a gate of the second slew rate transistor is coupled to a gate voltage supplied to a gate of the common source transistor, and
    the switchably enabled selector is coupled to the second slew rate transistor and configured to adjust a threshold voltage of the second slew rate transistor to a first voltage during a first phase of the settling period and a second voltage higher than the first voltage during a second phase of the settling period.

7. The cascode amplifier of claim 1, wherein the slew rate booster includes a transistor coupled to the switchably enabled selector, the transistor supplied with a gate voltage at least equal to that supplied to a gate of the common gate transistor.

8. The cascode amplifier of claim 7, wherein the switchably enabled selector is coupled between a drain of the transistor included in the slew rate booster and the drain of the common gate transistor.

9. The cascode amplifier of claim 7, wherein the switchably enabled selector is coupled between a gate of the transistor included in the slew rate booster and the gate voltage supplied to the gate of the transistor included in the slew rate booster.

10. The cascode amplifier of claim 1, further comprising an additional transistor, wherein the slew rate booster is coupled between a drain of the additional transistor and a drain of the common gate transistor.

11. A cascode amplifier comprising:
    a common gate transistor;
    a common source transistor coupled in series to the common gate transistor; and
    a slew rate booster coupled to a drain of the common gate transistor and configured to vary a signal current flow through the slew rate booster during a settling period of a capacitor switching operation, wherein the slew rate booster includes a transistor coupled to a switchably enabled selector, the transistor supplied with a gate voltage at least equal to that supplied to a gate of the common gate transistor.

12. The cascode amplifier of claim 11, wherein the switchably enabled selector is coupled between a drain of the transistor included in the slew rate booster and the drain of the common gate transistor.

13. The cascode amplifier of claim 11, wherein the switchably enabled selector is coupled between a gate of the transistor included in the slew rate booster and the gate voltage supplied to the gate of the transistor included in the slew rate booster.

14. A cascode amplifier comprising:
    a common gate transistor;
    a common source transistor coupled in series to the common gate transistor;
    a slew rate booster coupled to a drain of the common gate transistor and configured to vary a signal current flow through the slew rate booster during a settling period of a capacitor switching operation; and
    an additional transistor, wherein the slew rate booster is coupled between the drain of the additional transistor and the drain of the common gate transistor.

15. A cascode amplifier comprising:
    a common gate transistor;
    a common source transistor coupled in series to the common gate transistor; and
    a slew rate booster coupled to a drain of the common gate transistor and configured to vary a signal current flowing through the slew rate booster during a settling period of a capacitor switching operation, wherein:
    the slew rate booster includes a first slew rate transistor and a second slew rate transistor having a higher threshold voltage than the common source transistor,
    a drain of the first slew rate transistor is coupled to the drain of the common gate transistor, a gate of the first slew rate transistor is supplied with a gate voltage at least equal to that supplied to a gate of the common gate transistor, a source of the first slew rate transistor is coupled to a drain of the second slew rate transistor, and a gate of the second slew rate transistor is coupled to a gate voltage supplied to a gate of the common source transistor.

16. A method comprising:

adjusting a voltage or a current flow at a source of a current buffer transistor in a cascode amplifier during a first phase of a capacitor switching operation settling period;

readjusting the voltage or the current flow during a second phase of the capacitor switching operation settling period; and sampling an output voltage of the current buffer transistor at an end of the capacitor switching operation settling period.

17. The method of claim 16, wherein:

the current buffer transistor is NMOS, the adjusting the voltage or the current flow during the first phase includes increasing the voltage or the current flow at the source of the current buffer transistor during the first phase, and the readjusting the voltage or the current flow during the second phase includes decreasing the voltage or the current flow previously increased during the first phase.

18. The method of claim 16, wherein:

the current buffer transistor is PMOS, the adjusting the voltage or the current flow during the first phase includes at least one of decreasing the voltage and increasing the current flow at the source of the current buffer transistor during the first phase, and the readjusting the voltage or the current flow during the second phase includes increasing the voltage or the current flow previously decreased during the first phase.

19. The method of claim 16, further comprising identifying a capacitor switching operation before adjusting the voltage or the current flow.

20. The method of claim 16, wherein the voltage at the source of the current buffer transistor is increased during the first phase and the voltage at the source of the current buffer transistor is decreased during the second phase.

21. The method of claim 16, wherein the voltage at the source of the current buffer transistor is decreased during the first phase and the voltage at the source of the current buffer transistor is increased during the second phase.

22. The method of claim 16, wherein the current flow at the source of the current buffer transistor is increased during the first phase and the current flow at the source of the current buffer transistor is decreased during the second phase.

23. The method of claim 16, wherein the current flow at the source of the current buffer transistor is decreased during the first phase and the current flow at the source of the current buffer transistor is increased during the second phase.

24. The method of claim 16, wherein the cascode amplifier includes a common gate transistor coupled in series to a common source transistor and the current buffer transistor is the common gate transistor.

25. A cascode amplifier comprising:

a plurality of transistors coupled in series; and a slew rate booster coupled to at least one of the transistors and configured to adjust a voltage at the at least one transistor to keep another of the transistors saturated during an input signal glitch, the slew rate booster including a switchably enabled selector configured to enable and prevent a signal current flow through the slew rate booster in response to a control signal.

26. The cascode amplifier of claim 25, wherein the switchably enabled selector is configured to enable the signal current flow through the slew rate booster in response to a first clock phase of the control signal and prevent the signal current flow in response to a second clock phase of the control signal.

27. The cascode amplifier of claim 26, wherein the slew rate booster includes a transistor coupled to the switchably enabled selector, the transistor supplied with a gate voltage at least equal to that supplied to a gate of the at least one of the transistors coupled in series.

28. The cascode amplifier of claim 27, wherein the switchably enabled selector is coupled between a drain of the transistor included in the slew rate booster and the drain of the at least one of the transistors coupled in series.

29. The cascode amplifier of claim 27, wherein the switchably enabled selector is coupled between a gate of the transistor included in the slew rate booster and the gate voltage supplied to the gate of the transistor included in the slew rate booster.

30. A cascode amplifier comprising:

a plurality of transistors coupled in series;

a slew rate booster coupled to at least one of the transistors and configured to adjust a voltage at the at least one transistor to keep another of the transistors saturated during an input signal glitch; and an additional transistor, wherein the slew rate booster is coupled between a drain of the additional transistor and a drain of the at least one of the transistors coupled in series.

31. A cascode amplifier comprising:

a first transistor having a gate configured to receive a bias voltage;

a second transistor coupled in series with the first transistor, the second transistor having a gate configured to receive an input voltage; and a slew rate booster coupled to a drain of the first transistor and including a switchably enabled selector configured to vary the signal current flow through the slew rate booster in response to a control signal.

32. A method comprising:

adjusting a voltage or a current flow in a current buffer transistor in a cascode amplifier during a first phase of a control signal;

readjusting the voltage or the current flow during a second phase of the control signal; and providing an output voltage of the current buffer transistor at an end of the second phase of the control signal.

* * * * *